United States Patent
Fan

(10) Patent No.: US 9,859,233 B1
(45) Date of Patent: Jan. 2, 2018

(54) SEMICONDUCTOR DEVICE PACKAGE WITH REINFORCED REDISTRIBUTION LAYER

(71) Applicant: POWERTECH TECHNOLOGY INC., Hsinchu County (TW)

(72) Inventor: Wen-Jeng Fan, Hsinchu County (TW)

(73) Assignee: POWERTECH TECHNOLOGY INC., Hsinchu County (TW)

( * ) Notice: Subject to any disclaimer, the term of this patent is extended or adjusted under 35 U.S.C. 154(b) by 0 days.

(21) Appl. No.: 15/390,531

(22) Filed: Dec. 25, 2016

(51) Int. Cl.
*H01L 23/52* (2006.01)
*H01L 23/00* (2006.01)
*H01L 23/31* (2006.01)
*H01L 21/56* (2006.01)

(52) U.S. Cl.
CPC .............. *H01L 24/02* (2013.01); *H01L 21/56* (2013.01); *H01L 23/3128* (2013.01); *H01L 24/17* (2013.01); *H01L 2224/0239* (2013.01); *H01L 2224/02317* (2013.01); *H01L 2224/02371* (2013.01); *H01L 2224/02373* (2013.01); *H01L 2224/17104* (2013.01)

(58) Field of Classification Search
CPC ..... H01L 24/02; H01L 21/56; H01L 23/3128; H01L 24/17
USPC ......................................................... 257/737
See application file for complete search history.

(56) References Cited

U.S. PATENT DOCUMENTS

| | | | |
|---|---|---|---|
| 9,000,584 B2* | 4/2015 | Lin | ......................... H01L 24/19 257/737 |
| 9,461,018 B1* | 10/2016 | Tsai | .................... H01L 21/6836 |
| 2013/0307140 A1* | 11/2013 | Huang | .............. H01L 23/49827 257/737 |

* cited by examiner

*Primary Examiner* — Luan C Thai
(74) *Attorney, Agent, or Firm* — Winston Hsu

(57) ABSTRACT

A semiconductor device package includes an encapsulation layer, a die, at least one trace stiffener, and a redistribution layer. The encapsulation layer has an opening. The die is disposed in the opening of the encapsulation layer. The redistribution layer is formed above the die and the encapsulation layer. The least one trace stiffener are formed on the redistribution layer above boundaries of the encapsulation layer and the die for reinforcing a structure of the redistribution layer above the boundaries of the encapsulation layer and the die.

16 Claims, 13 Drawing Sheets

SEMICONDUCTOR DEVICE PACKAGE WITH REINFORCED REDISTRIBUTION LAYER

BACKGROUND OF THE INVENTION

1. Field of the Invention

This invention is related to a semiconductor device package, especially related to a semiconductor device package having a reinforced redistribution layer.

2. Description of the Prior Art

Since the requirement for the chip area of electronic devices has become more and more strict, packaging for semiconductor device faces challenges to reduce its size. Due to the advantage of a smaller packaging size, the Fan In or Fan Out chip scale package (CSP) has become a popular way to satisfy the requirements of the market.

To reduce the area required by the pin assignment in the CSP, the redistribution layer structure is used to reroute the input/output pins for increasing the original pitch of chip pads to be larger. It will help to mount terminal solder bumps or balls and connected to other substrates or PCB structure.

Because of the requirements of increasing I/O counts and the complicate conditions on the boundaries between homogeneous or heterogeneous materials of multi-chips, it is necessary to route the redistribution layer outside of chips areas and solder balls will be put outside chip areas. In this kind of fan out package, the redistribution layer may be formed above two different materials, the silicon die and the encapsulation layer (e.g. epoxy molding compound) surrounding the silicon die. Since the coefficients of thermal expansion of the silicon die and the encapsulation layers are different (silicon 3 ppm/C, encapsulation 10-50 ppm/C), the structure of the redistribution layer can be damaged due to serious thermal stress caused by severe temperature changes.

SUMMARY OF THE INVENTION

One embodiment of the present invention discloses a semiconductor device package. The semiconductor device package includes an encapsulation layer having an opening, a die disposed in the opening of the encapsulation layer, and a redistribution layer formed above the die and the encapsulation layer. The redistribution layer has at least one trace extending across an interface between the active surface and the encapsulation layer. The semiconductor device further includes at least one trace stiffener formed on the at least one trace of the redistribution layer above boundaries of the encapsulation layer and the die for reinforcing a structure of the redistribution layer above the boundaries of the encapsulation layer and the die.

Another embodiment of the present invention discloses a method for forming a semiconductor device package. The method includes disposing a die on a carrier, molding the die on the carrier to form an encapsulation layer surrounding the die, forming a redistribution layer above the die and the encapsulation layer, and forming at least one trace stiffener. The redistribution layer has at least one trace extending across an interface between the active surface and the encapsulation layer. The at least one trace stiffener are formed on the at least one trace of the redistribution layer above boundaries of the encapsulation layer and the die for reinforcing a structure of the redistribution layer above the boundaries of the encapsulation layer and the die.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
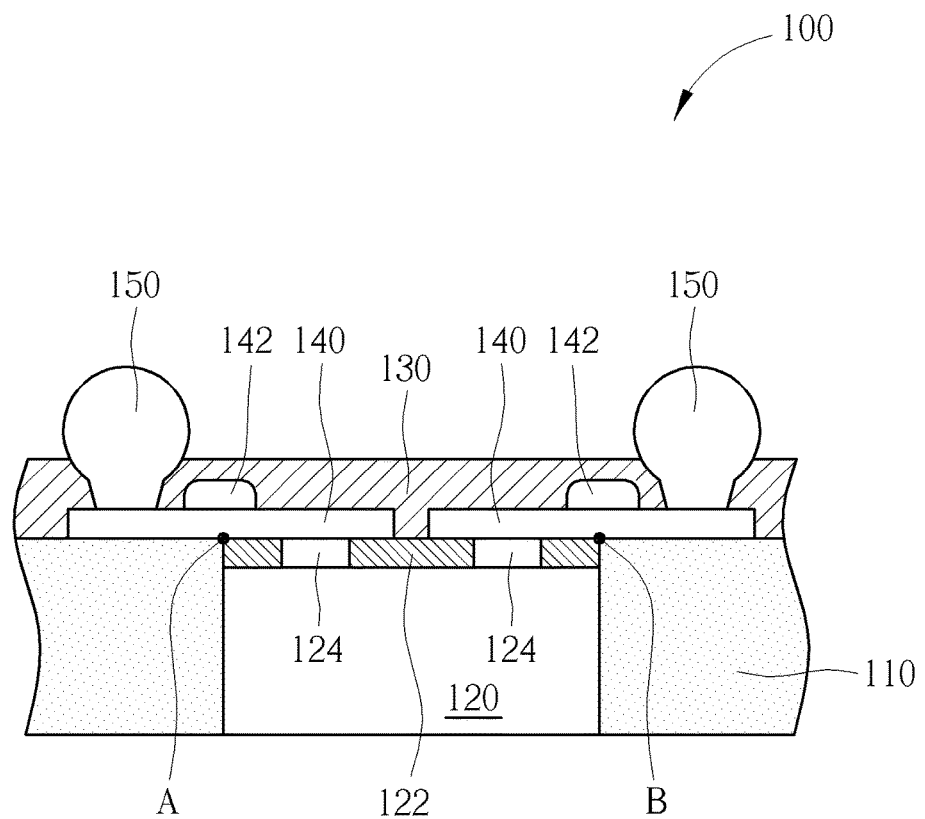
FIG. 1 shows a cross-section of a semiconductor device package according to one embodiment of the present invention.

FIG. 1 shows a cross-section of a semiconductor device package 100 according to one embodiment of the present invention. The semiconductor device package 100 includes an encapsulation layer 110, a die 120, a dielectric layer 130, a redistribution layer 140, trace stiffeners 142 and soldering bumps 150.

The encapsulation layer 110 has an opening, and the die 120 is disposed in the opening of the encapsulation layer 110. The encapsulation layer 110 can be the epoxy molding compound such as resin, and the die 120 can be a chip sliced from a wafer and can be designed to perform operations through its input/output pins 124. The input/output pins 124 are disposed on an active surface of the die 120. In some embodiments, the die 120 may also include a dielectric layer 122 on its active surface with openings on the input/output pins 124 of the die 120. The dielectric layer 122 may be used to protect the die 120 from being damaged or shorted. In this case, the redistribution layer 140 may be formed above the die 120 and the encapsulation layer 110 directly, reducing the number of dielectric layers.

The redistribution layer 140 is coupled to the input/output pins 124 of the die 120 for rerouting the input/output pins 124 of the die 120. The soldering bumps 150 are disposed on the redistribution layer 140. Also, the dielectric layer 130 may be disposed on the redistribution layer 140, the die 120 and the encapsulation layer 110 where no soldering bumps 150 are disposed, thereby protecting the redistribution layer 140, the die 120 and the encapsulation layer 110. In some embodiments, the dielectric layer 130 can be formed by polyimide (PI).

In FIG. 1, the redistribution layer 140 has traces extending across an interface between the active surface of the die 120 and the encapsulation layer 110. Since the coefficient of thermal expansion (CTE) of the die 120 is lower than the coefficient of thermal expansion of the encapsulation layer 110, the traces of the redistribution layer 140 may be damaged because of the thermal stress caused by severe temperature changes, if not reinforced. Therefore, the trace stiffener 142 may be formed on portions of the traces of the redistribution layer 140 formed above the boundaries A and B of the encapsulation layer 110 and the die 120 for reinforcing the structure of the redistribution layer 140 above the boundary of the encapsulation layer 110 and the die 120.

In some embodiments of the present invention, the redistribution layer 140 and the trace stiffener 142 may be of the same material. For example, both of the redistribution layer 140 and the trace stiffener 142 may be of copper, aluminum or other electrically conductive materials. Since the trace stiffener 142 is mainly for ensuring the conductivity of the traces formed by the redistribution layer 140, the conductive rate of the trace stiffener 142 should not be lower than the conductive rate of the redistribution layer 140.

In some embodiments, the redistribution layer 140 and the trace stiffener 142 may be formed by plating, such as sputtering, electroplating, and etc. Also, to ensure the redistribution layer 140 have a stronger structure above the boundaries A and B of the encapsulation layer 110 and the die 120, the thickness of the trace stiffener 142 may be greater than or equal to half the thickness of the redistribution layer 140. In addition, the trace stiffeners 142 are open in both sides and are not connected to the soldering bumps 150 directly. The trace stiffener 142 may be coupled to the corresponding soldering bumps 150 through the redistribution layer 140. Therefore, the soldering bumps 150 may be planted smoothly without causing different heights of the soldering bumps.

Figure 20:
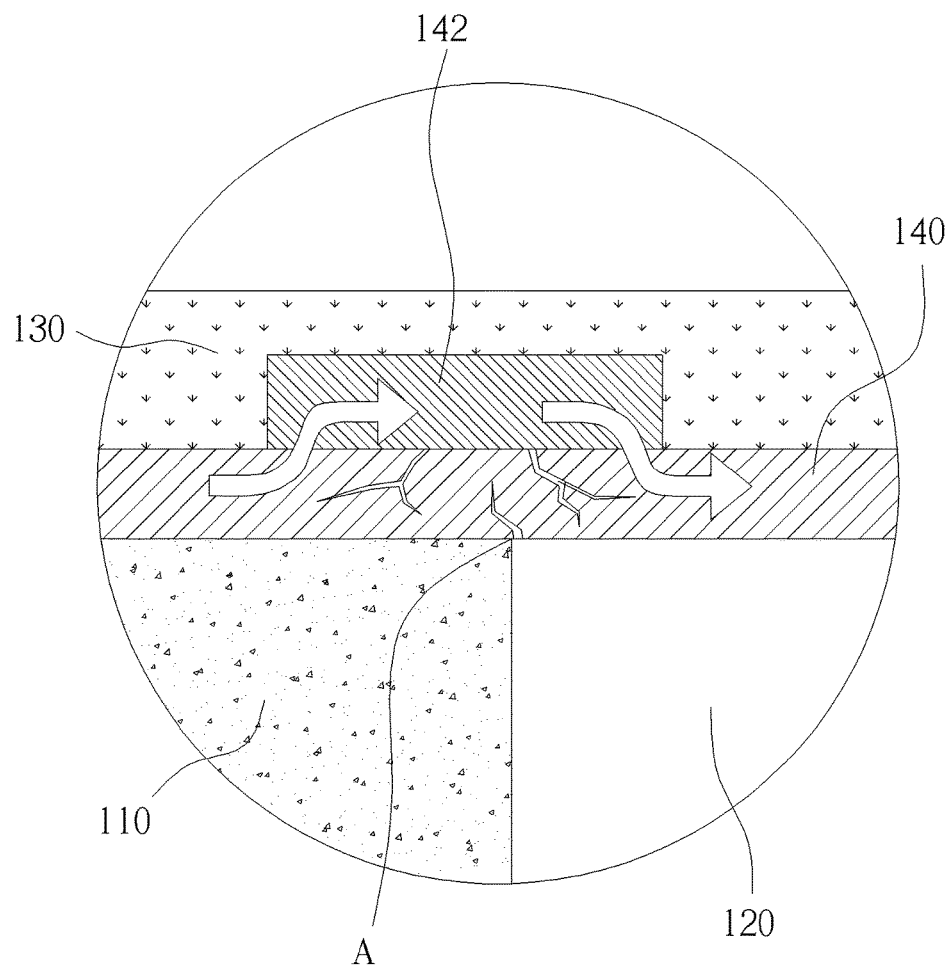
FIG. 20 shows an enlarged view of the trace stiffener in FIG. 1.

FIG. 20 shows an enlarged view of the trace stiffener 142. In FIG. 20, although the thermal stress may cause defects in the redistribution layer 140, the trace stiffener 142 may help to keep the trace conductive. That is, since the trace stiffener 142 are positioned on the redistribution layer 140 above the boundary A of the encapsulation layer 110 and the die 120, the structure and conductivity of the redistribution layer 140 can be enhanced to endure the stress caused by the difference between the coefficients of thermal expansion of the die 120 and the encapsulation layer 110 under temperature variations.

Figure 19:
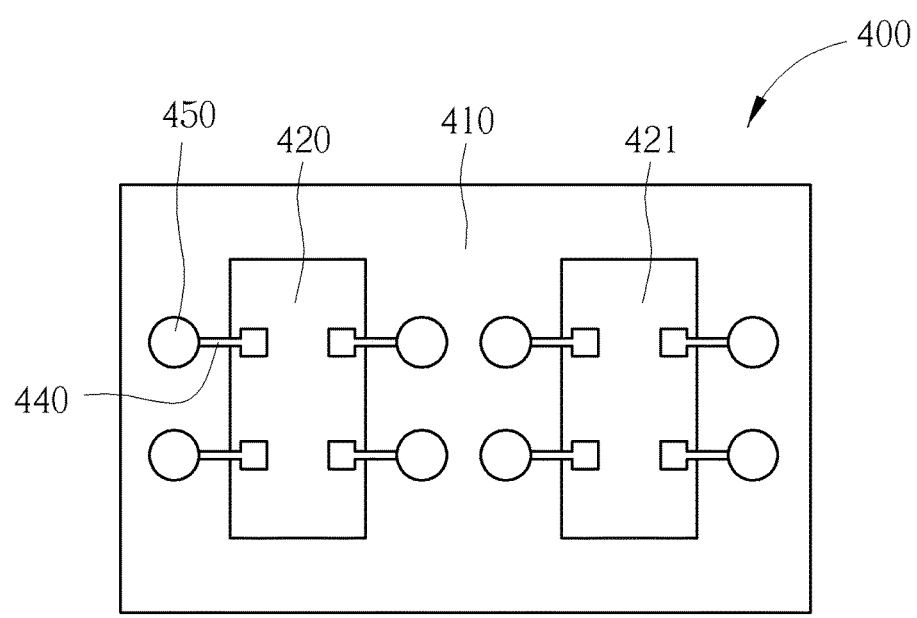
FIG. 19 shows a top view of a semiconductor device package according to one embodiment of the present invention.

In FIG. 1, the semiconductor device 100 includes the die 120, however, in some embodiments, the semiconductor device may further include more dies. FIG. 19 shows a top view of a semiconductor device 400. The semiconductor device 400 includes an encapsulation layer 410, two dies 420 and 421, a redistribution layer 440, the trace stiffeners 442, and soldering bumps 450. The structure of the semiconductor device 400 is similar to the structure of the semiconductor device 100. That is, a cross-section view of the die 420 or the die 421 may be similar to the cross-section view shown in FIG. 1. Also, in some embodiments, the semiconductor device may include even more dies according to the requirements.

Figure 2:
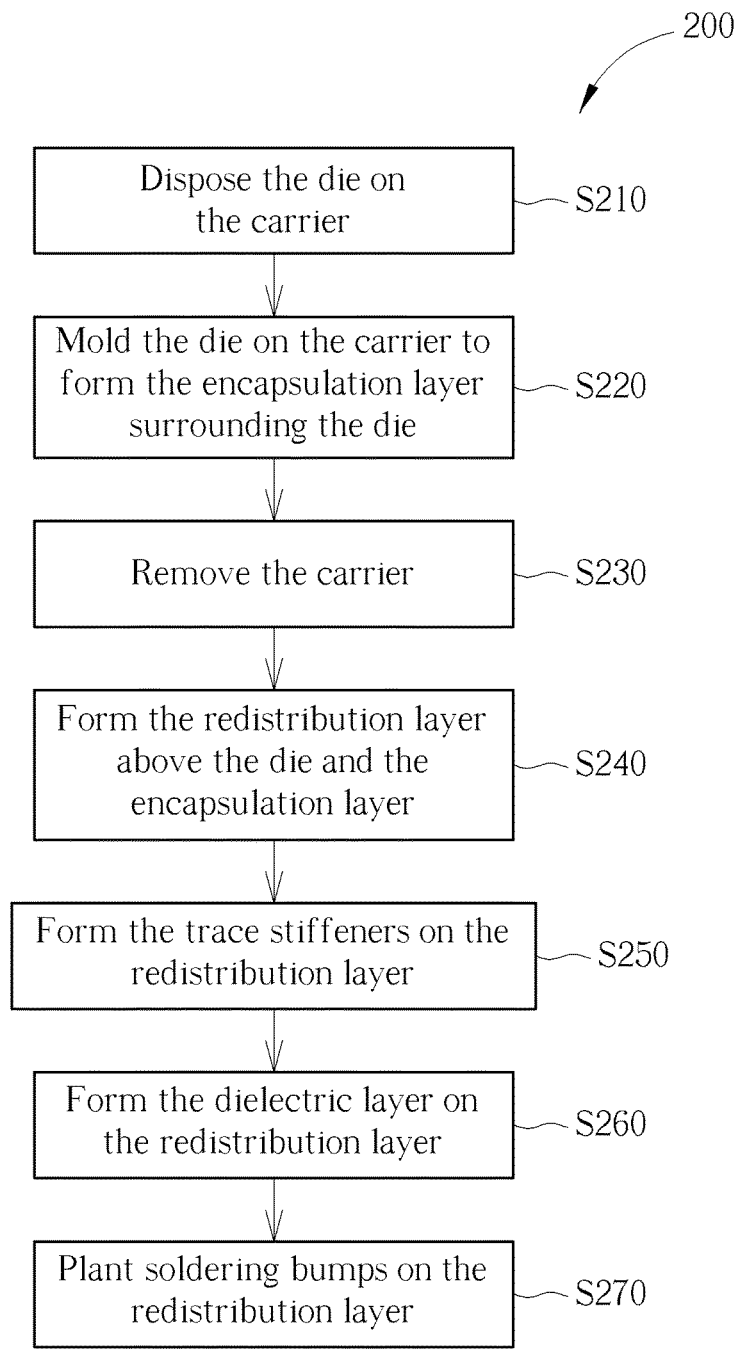
FIG. 2 shows a flow chart of a method for forming the semiconductor device package in FIG. 1 according to one embodiment of the present invention.
Figure 3:
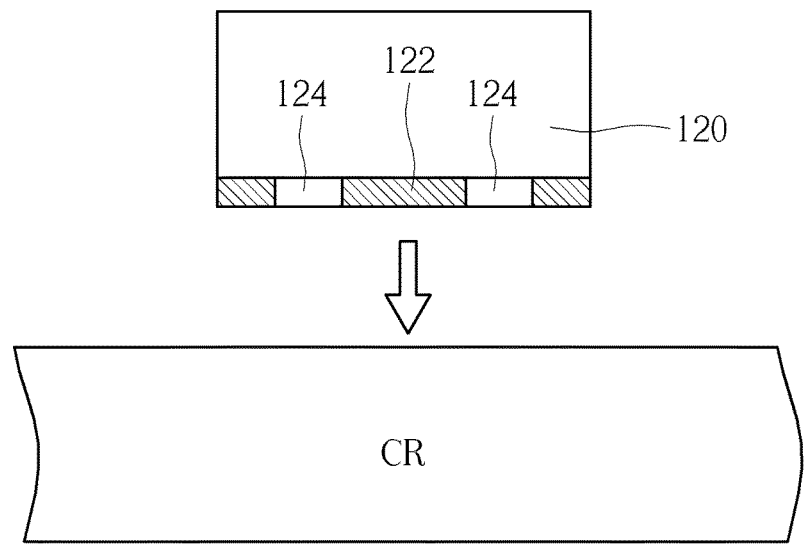
FIGS. 3 to 9 show the structures corresponding to steps of the method in FIG. 2 respectively.
Figure 4:
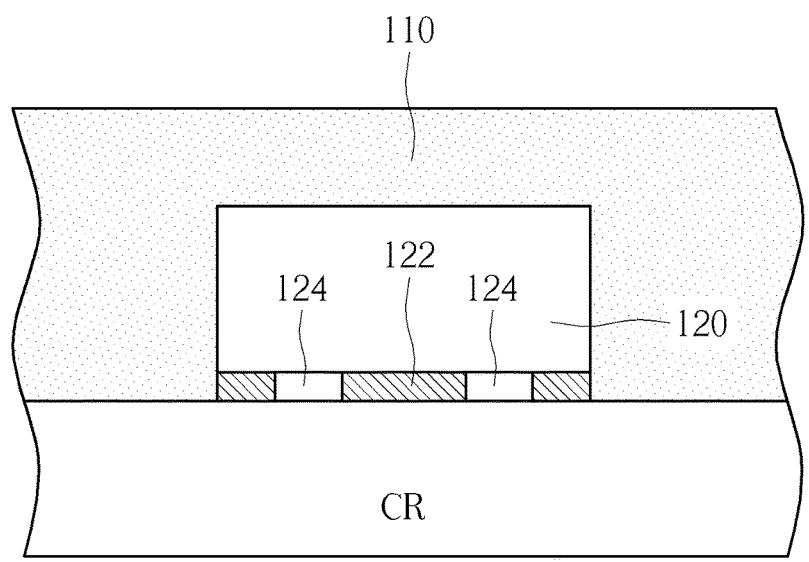
Figure 5:
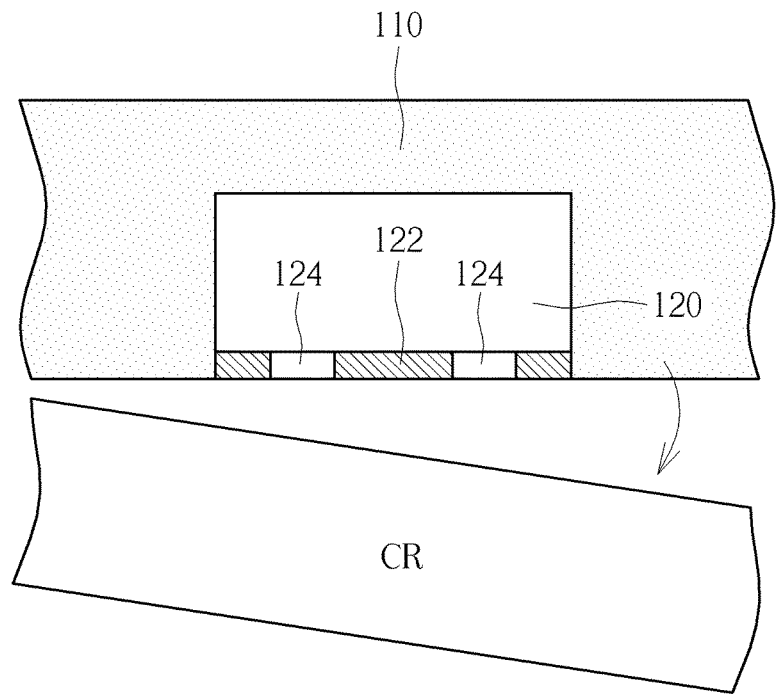
Figure 6:
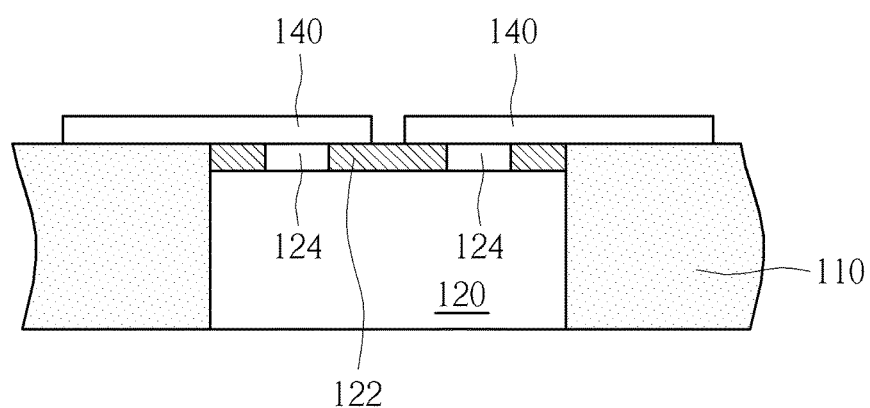
Figure 7:
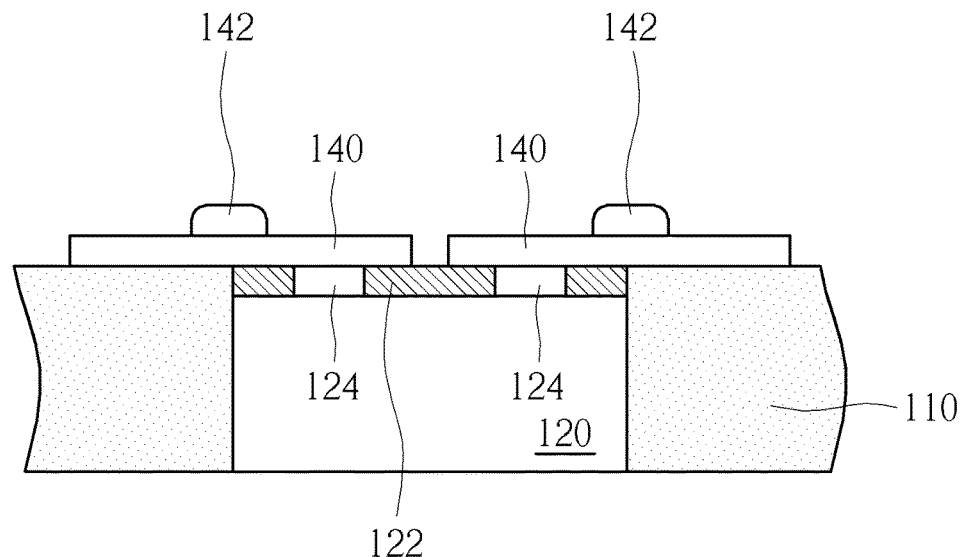
Figure 8:
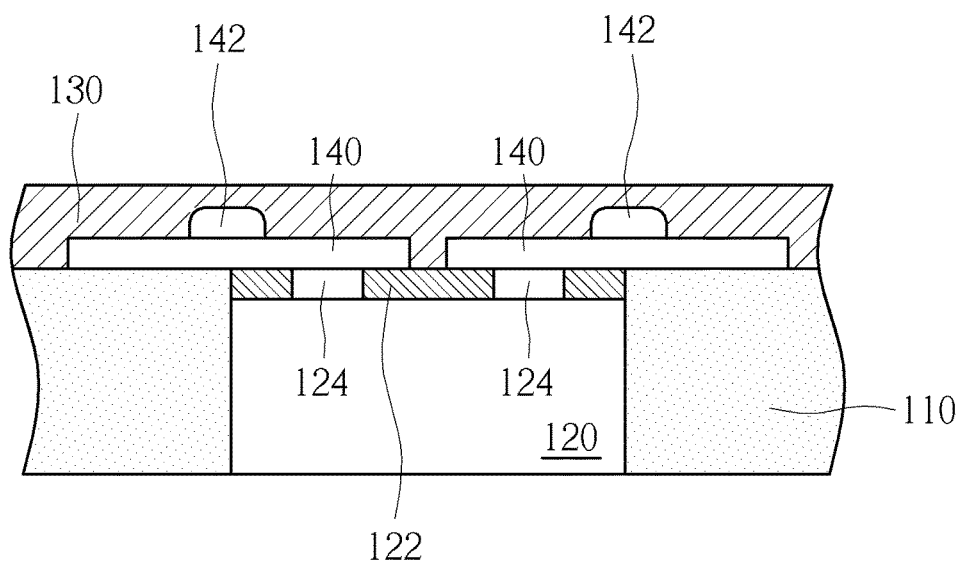
Figure 9:
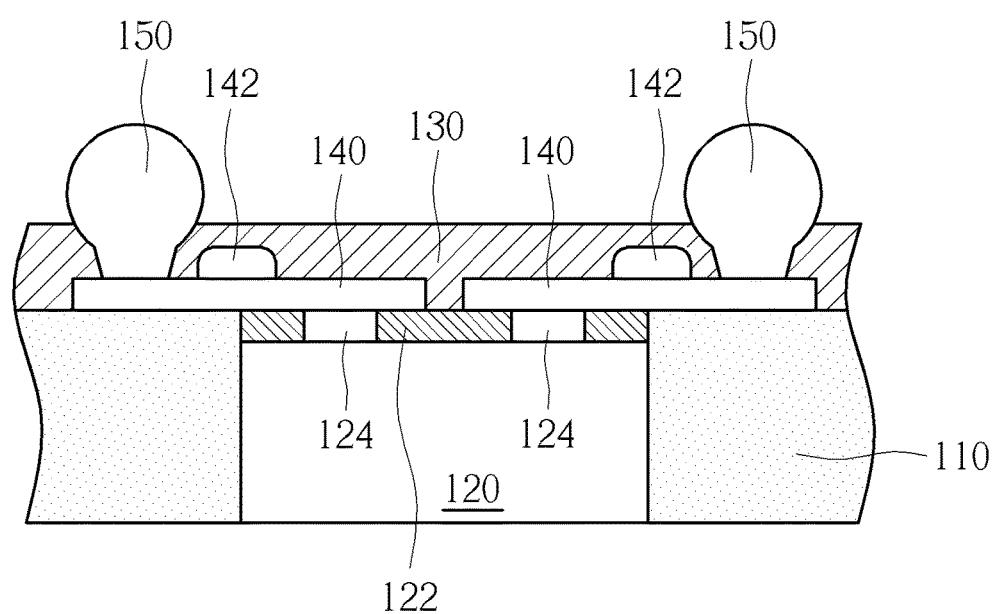

FIG. 2 shows a flow chart of a method 200 for forming the semiconductor device package 100. The method 200 includes steps S210 to S270. FIGS. 3 to 9 show the structures corresponding to steps S210 to S270 respectively.
S210: disposing a die 120 on a carrier CR;
S220: molding the die 120 on the carrier CR to form an encapsulation layer 110 surrounding the die 120;
S230: removing the carrier CR;
S240: forming a redistribution layer 140 above the die 120 and the encapsulation layer 110;
S250: forming trace stiffeners 142 on the redistribution layer 140 above boundaries of the encapsulation layer 110 and the die 120;
S260: forming a dielectric layer 130 on the redistribution layer 140, the encapsulation layer 110, and the die 120;
S270: planting soldering bumps 150 on the redistribution layer 140.

In step S210, the die 120 can be picked up and disposed on the carrier CR by a fine alignment machine. In step S220, the encapsulation layer 110 is formed by molding the die 120 for protecting the die 120. In step S230, the carrier CR is removed. In step S240, the die 120 and the resin 110 are flipped and the redistribution layer 140 is formed above active surface of the die 120 and the encapsulation layer 110 to couple the input/output pins 124 of the die 120 for rerouting the input/output pins of the die 120. In step S250, the trace stiffeners 142 is formed on portions of the redistribution layer 140 formed above the boundary of the encapsulation layer 110 and the die 120 for reinforcing the structure of the redistribution layer 140 formed above the boundary of the encapsulation layer 110 and the die 120. In some embodiments, the trace stiffeners 142 may be formed by additional partial plating on the redistribution layer 140. In step S260, the dielectric layer 130 is formed on the redistribution layer 140, the encapsulation layer 110, and the die 120 with opening for the planting of soldering bumps 150 later on. In step S270, the soldering bumps 150 are disposed on the redistribution layer 140.

In addition, to further reduce the thickness of the semiconductor device 100, the method 200 may include a step of grinding the encapsulation layer 110 to reveal the back surface of the die 120.

In some embodiments, the redistribution layer 140 and the trace stiffener 142 may be formed using conductive metals such as copper or aluminum, and redistribution layer 140 and the trace stiffener 142 may be formed by plating, such as sputtering, electroplating, or ion plating.

Figure 10:
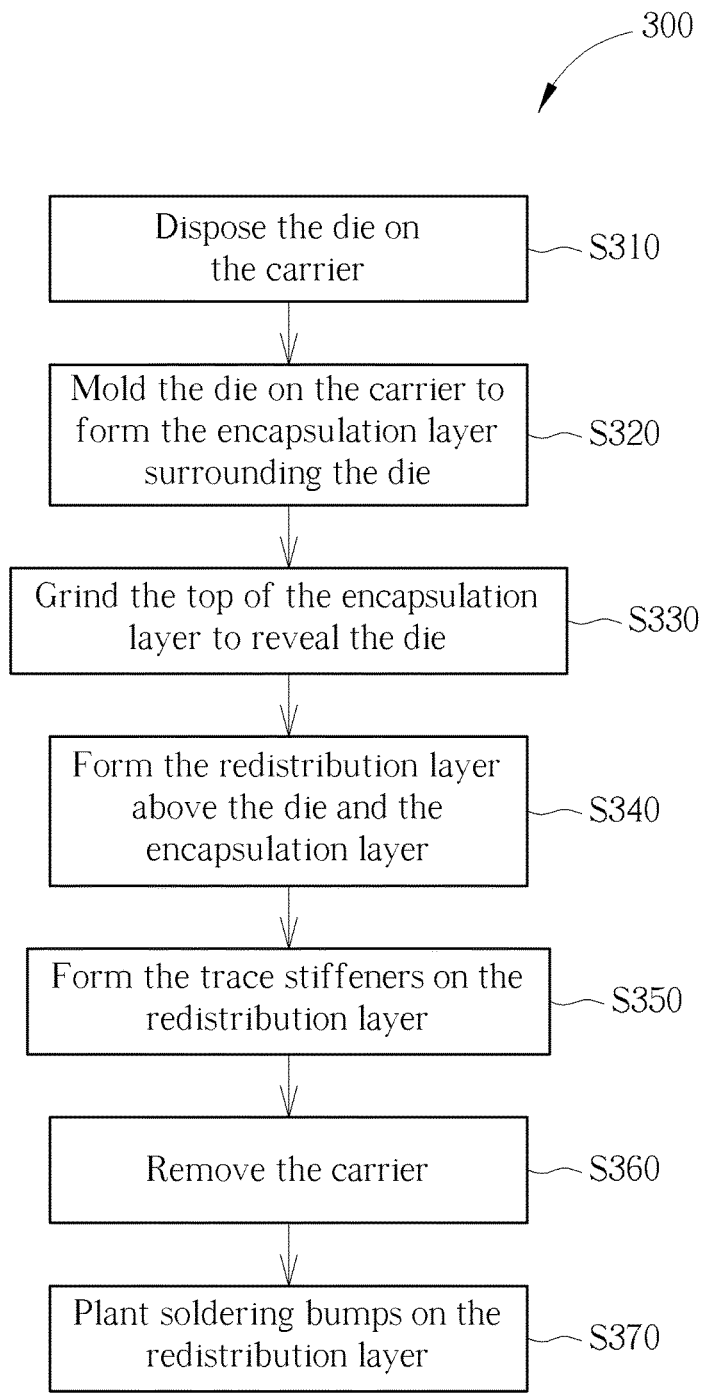
FIG. 10 shows a flow chart of a method for forming the semiconductor device package in FIG. 1 according to another embodiment of the present invention.
Figure 11:
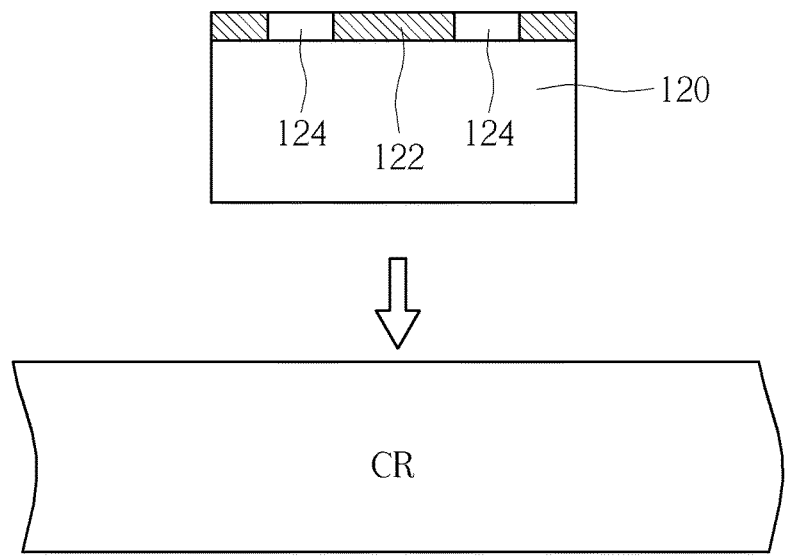
FIGS. 11 to 18 show the structures corresponding to steps of the method in FIG. 2 respectively.
Figure 12:
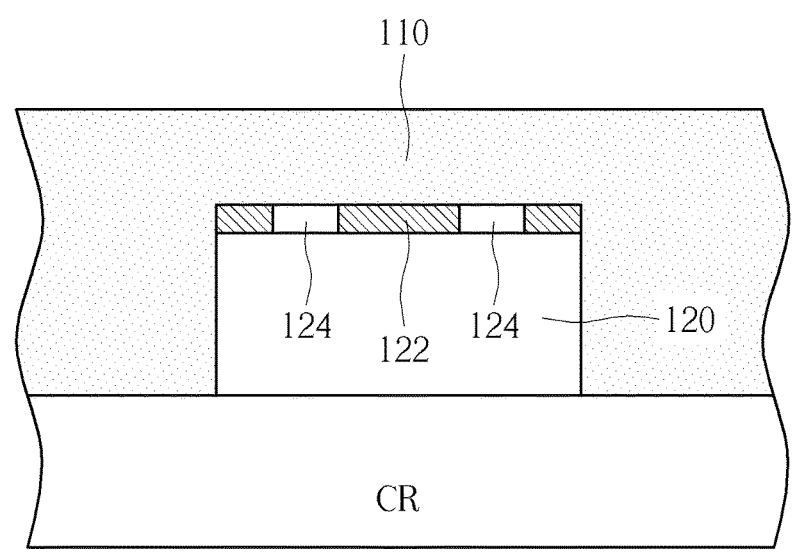
Figure 13:
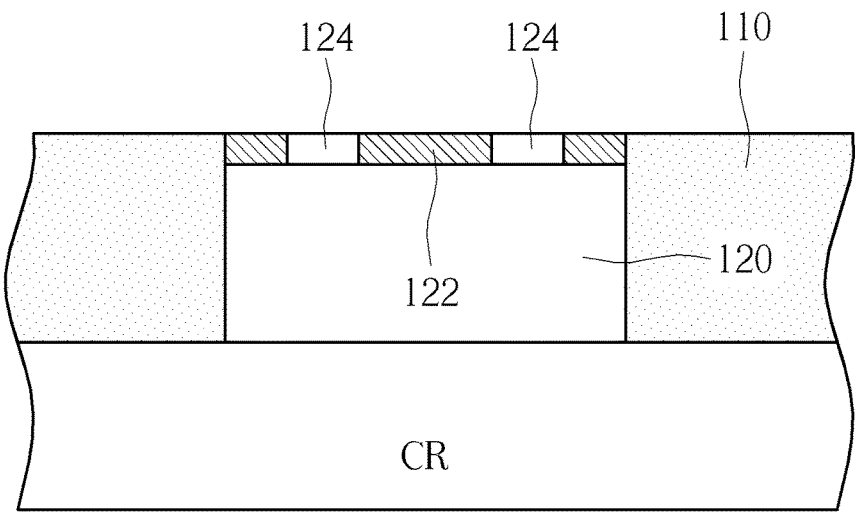
Figure 14:
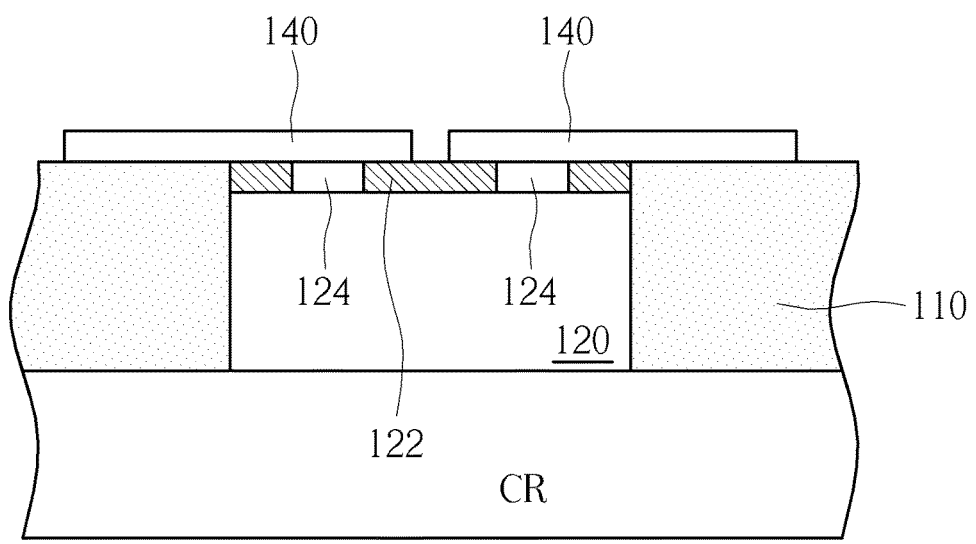
Figure 15:
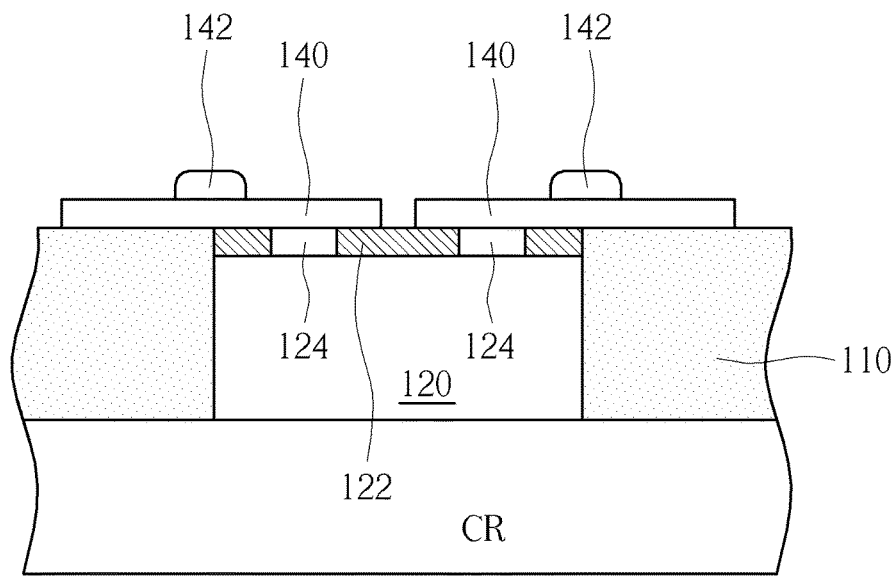
Figure 16:
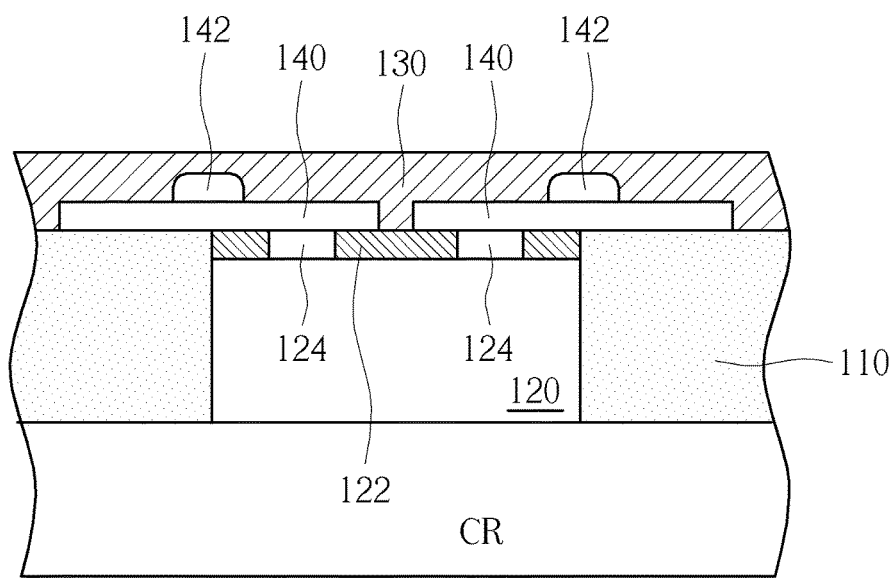
Figure 17:
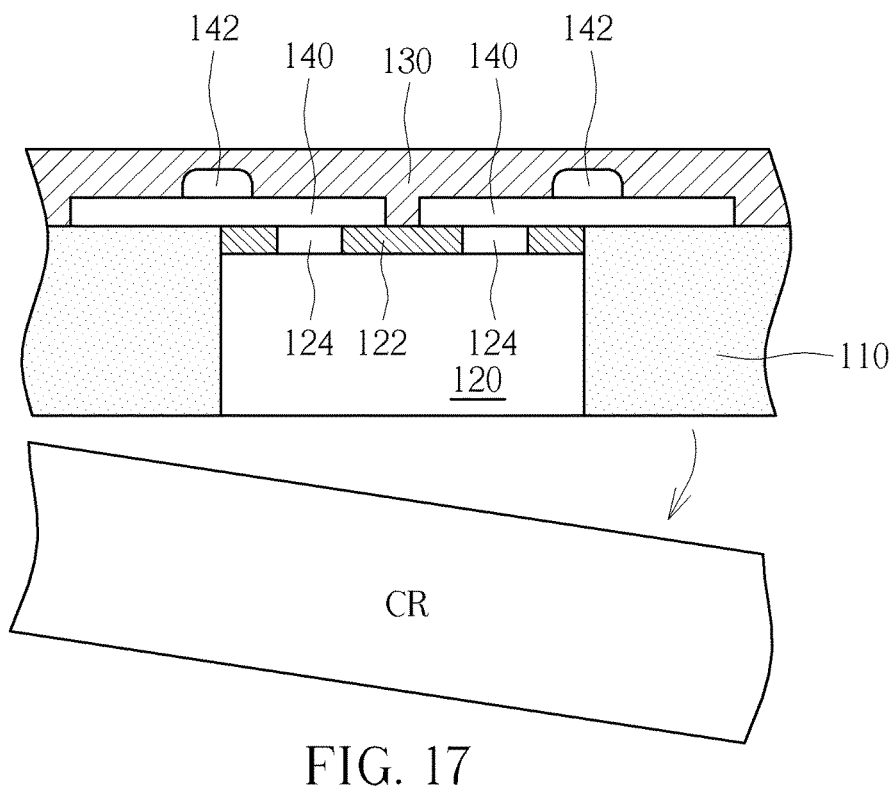
Figure 18:
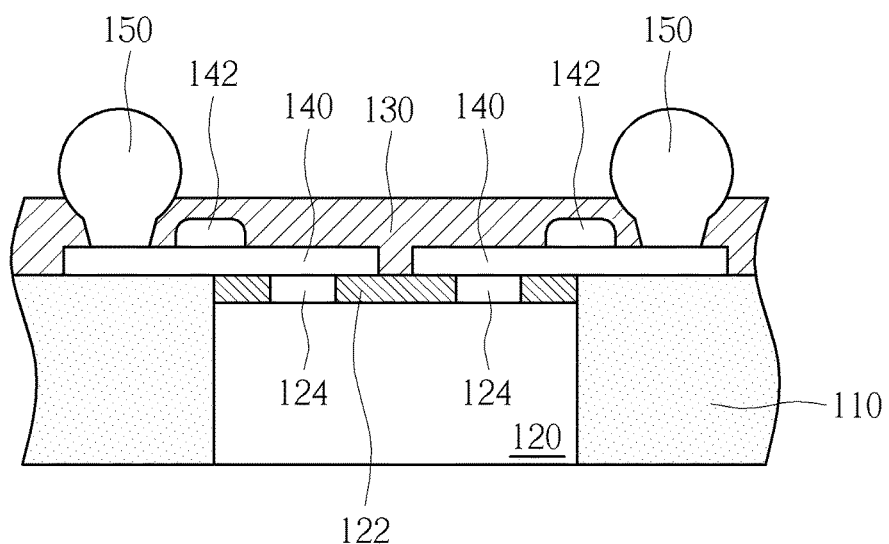

Although the method 200 is processed with the die 120 being face-down during the molding procedure, so the carrier CR must be removed in step S230 and the die 120 is flipped before the redistribution layer 140 is formed. However, in some embodiments, the die 120 can also be face-up during the molding procedure. For example, FIG. 10 shows a flow chart of a method 300 for forming the semiconductor device package 100 according to another embodiment of the present invention. The method 300 includes steps S310 to S380. FIGS. 11 to 18 show the structures corresponding to steps S310 to S380 respectively.
S310: disposing a die 120 on a carrier CR;
S320: molding the die 120 on the carrier CR to form an encapsulation layer 110 surrounding the die 120;
S330: grinding the top of the encapsulation layer 110 to reveal the die 120;
S340: forming a redistribution layer 140 above the die 120 and the encapsulation layer 110;
S350: forming trace stiffeners 142 on the redistribution layer 140 above boundaries of the encapsulation layer 110 and the die 120;
S360: forming a dielectric layer 130 on the redistribution layer 140;
S370: removing the carrier CR;
S380: planting soldering bumps 150 on the redistribution layer 140.

In FIGS. 11 to 18, the die 120 is disposed face-up on the carrier CR. Therefore, instead of removing the carrier CR, the encapsulation layer 110 is ground to reveal the active surface of the die 120 in step S330 before the redistribution layer 140 is formed in step S340.

According to methods 200 and 300, since the trace stiffeners 142 are formed on the redistribution layer 140 above the boundary of the encapsulation layer 110 and the die 120, the structure of the redistribution layer 140 is enhanced to endure the stress caused by the different coefficients of thermal expansion of the die 120 and the encapsulation layer 110 under temperature variations.

In summary, the semiconductor device package and the method for forming the semiconductor device package provided by the embodiments of the present invention can reinforce the structure of the redistribution layer above the boundary of the encapsulation layer and the die. Therefore, the redistribution layer is able to endure the stress caused by the different coefficients of thermal expansion of the die and the encapsulation layer under different temperatures.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device package comprising:
    an encapsulation layer having an opening;
    a die disposed in the opening of the encapsulation layer with an active surface of the die exposed through the encapsulation layer; and
    a redistribution layer formed on the active surface of the die and the encapsulation layer, and the redistribution layer having at least one trace extending across an interface between the active surface and the encapsulation layer, wherein the redistribution layer is coupled to input/output pins of the die;
    soldering bumps disposed on the redistribution layer; and
    at least one trace stiffener formed on a portion of the at least one trace of the redistribution layer disposed above boundaries of the encapsulation layer and the die for reinforcing a structure of the redistribution layer formed above the boundaries of the encapsulation layer and the die;
    wherein the at least one trace stiffener is not connected to the soldering bumps directly.

2. The semiconductor device package of claim 1, wherein the redistribution layer and the trace stiffener are of a same material.

3. The semiconductor device package of claim 2, wherein the redistribution layer and the trace stiffener are of copper or aluminum.

4. The semiconductor device package of claim 1, wherein the redistribution layer is formed by plating.

5. The semiconductor device package of claim 1, wherein the trace stiffener is formed by plating.

6. The semiconductor device package of claim 1, wherein a thickness of the trace stiffener is no smaller than half a thickness of the redistribution layer.

7. The semiconductor device package of claim 1, wherein a coefficient of thermal expansion of the die is smaller than a coefficient of thermal expansion of the encapsulation layer.

8. The semiconductor device package of claim 1, further comprising a dielectric layer formed on the redistribution layer, the encapsulation layer, and the die.

9. A method for forming a semiconductor device package comprising:
    disposing a die on a carrier;
    encapsulating the die on the carrier to form an encapsulation layer surrounding the die;
    forming a redistribution layer above the die and the encapsulation layer, wherein the redistribution layer is coupled to input/output pins of the die;
    planting soldering bumps on the redistribution layer; and
    forming at least one trace stiffener on the redistribution layer;
    wherein:
        the redistribution layer has at least one trace extending across an interface between an active surface and the encapsulation layer; and
        the at least one trace stiffener are formed on a portion of the at least one trace of the redistribution layer formed above boundaries of the encapsulation layer and the die for reinforcing a structure of the redistribution layer above the boundaries of the encapsulation layer and the die, wherein the at least one trace stiffener is not connected to the soldering bumps directly.

10. The method of claim 9, wherein the redistribution layer and the trace stiffener are of a same material.

11. The method of claim 9, wherein the redistribution layer and the trace stiffener are of copper or aluminum.

12. The method of claim 9, wherein forming the redistribution layer is plating the redistribution layer.

13. The method of claim 9, wherein forming the trace stiffener is plating the trace stiffener.

14. The method of claim 9, wherein a thickness of the trace stiffener is no smaller than half a thickness of the redistribution layer.

15. The method of claim 9, wherein a coefficient of thermal expansion of the die is smaller than a coefficient of thermal expansion of the encapsulation layer.

16. The method of claim 9, further comprising forming a dielectric layer on the redistribution layer, the encapsulation layer, and the die.

* * * * *